US005637793A

United States Patent [19]
Brinkman et al.

[11] Patent Number: 5,637,793
[45] Date of Patent: Jun. 10, 1997

[54] TEST CHUCK FOR ARMATURE TESTING

[75] Inventors: John C. Brinkman, Kettering; Ron E. Miller, Dayton, both of Ohio

[73] Assignee: Automation Technology Inc., Dayton, Ohio

[21] Appl. No.: 569,972

[22] Filed: Dec. 8, 1995

[51] Int. Cl.⁶ ............................................. G01M 15/00
[52] U.S. Cl. ................................... 73/118.1; 324/545
[58] Field of Search .......................... 73/116, 118.1; 324/389, 545, 772; 209/556, 571, 573; 248/55, 542, 644, 646, 651, 652, 655, 659, 669, 671, 672, 680, 132, 423, 176.1, 220.21, 221.11, 229.1, 229.14, 316.1; 269/269, 270, 274, 277

[56] References Cited

U.S. PATENT DOCUMENTS

| | | | |
|---|---|---|---|
| 2,654,065 | 9/1953 | Foust et al. | 324/545 |
| 2,661,172 | 12/1953 | Needham | 248/671 |
| 2,816,734 | 12/1957 | Crofoot | 248/55 |
| 3,145,960 | 8/1964 | Langdon | 248/671 |
| 3,687,406 | 8/1972 | Krahe et al. | 248/55 |
| 3,847,260 | 11/1974 | Fowler. | |
| 4,935,992 | 6/1990 | Due. | |
| 5,287,029 | 2/1994 | Krouse | 248/671 |

OTHER PUBLICATIONS

"Armature Test Systems" brochure by Automation Technology.

Primary Examiner—Robert Raevis
Attorney, Agent, or Firm—Biebel & French

[57] ABSTRACT

A method and apparatus for testing electric motor armatures includes a non-metallic chuck for supporting each armature during testing. The chuck includes three major components, namely, a lower saddle, an upper saddle, and an armature positioning mechanism. The lower saddle is attached to a lifting cylinder and carries each armature from a conveyor to a testing station. The upper saddle is permanently associated with the testing station. The armature positioning mechanism is attached to the upper saddle and includes a spring loaded metal dog which engages each armature as it is being lifted into position to rotate the armature into the proper position so that electrical contact wires extended from a test head will contact the contact bars of the armature commutator. Both the upper and lower saddles are made from a non-magnetic material, such as Nylon, but are provided with ceramic rollers which engage the armature to prevent wear. A cylinder retracts the metal dog during surge testing.

6 Claims, 5 Drawing Sheets

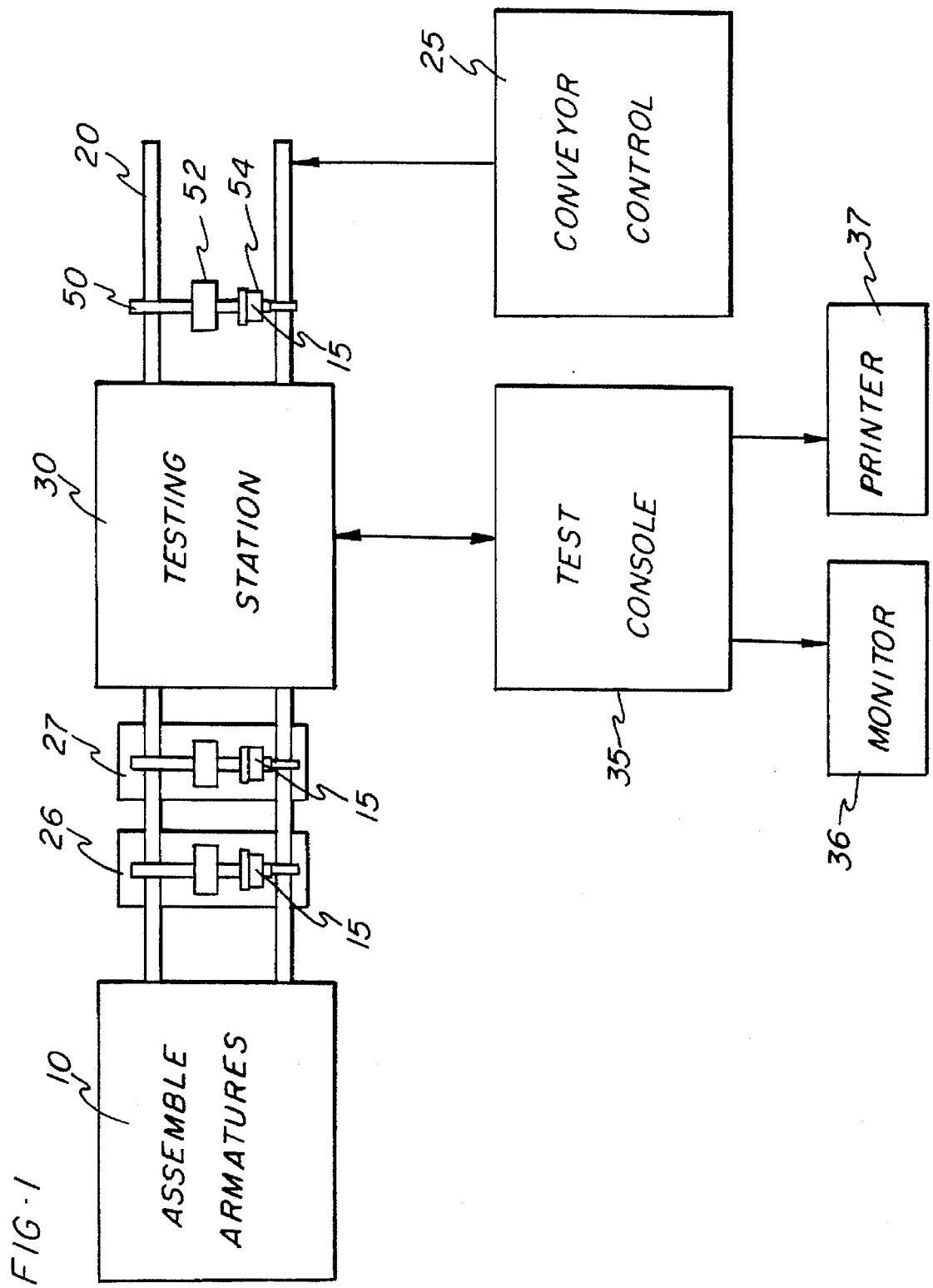

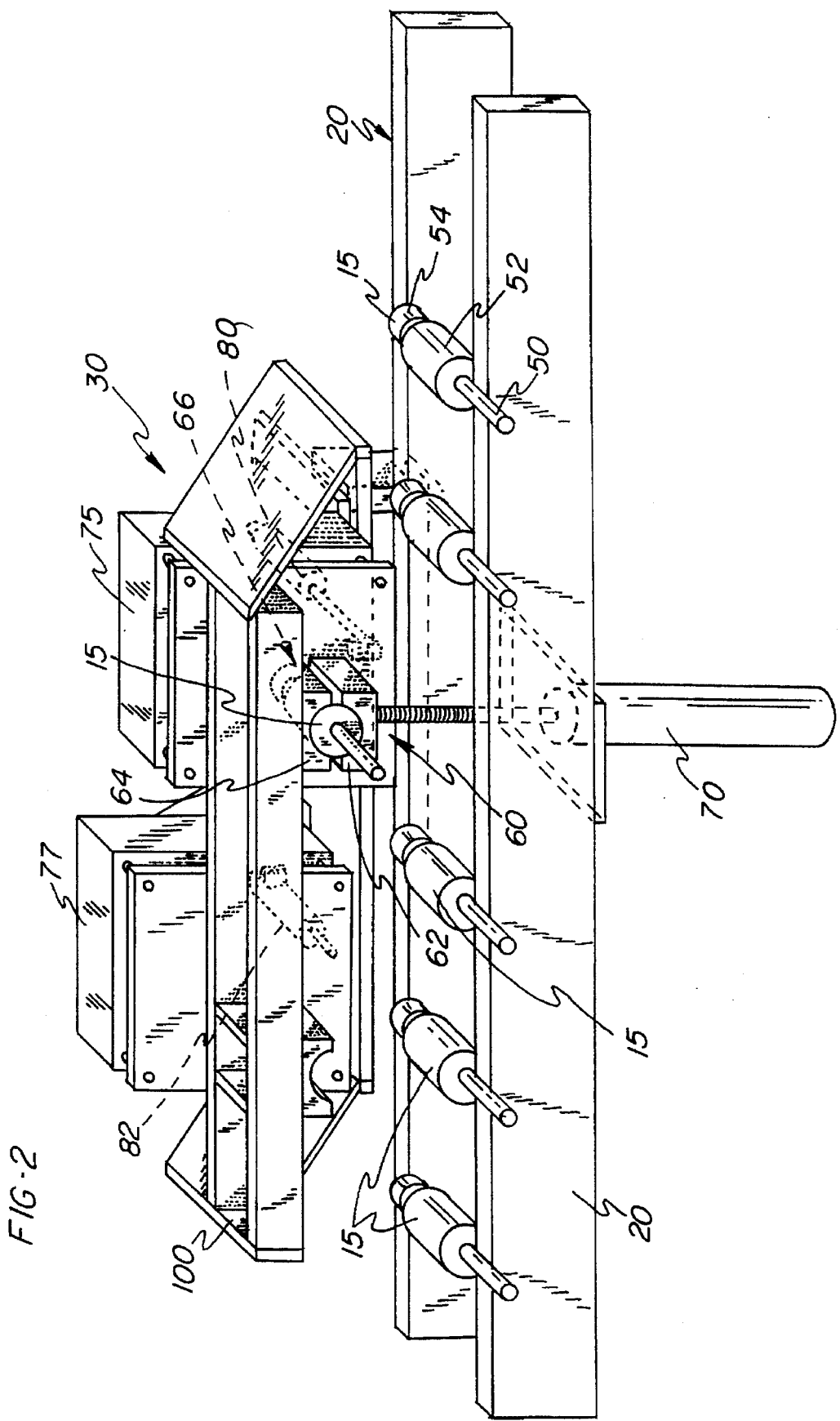

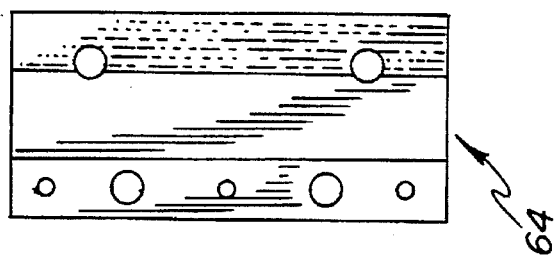
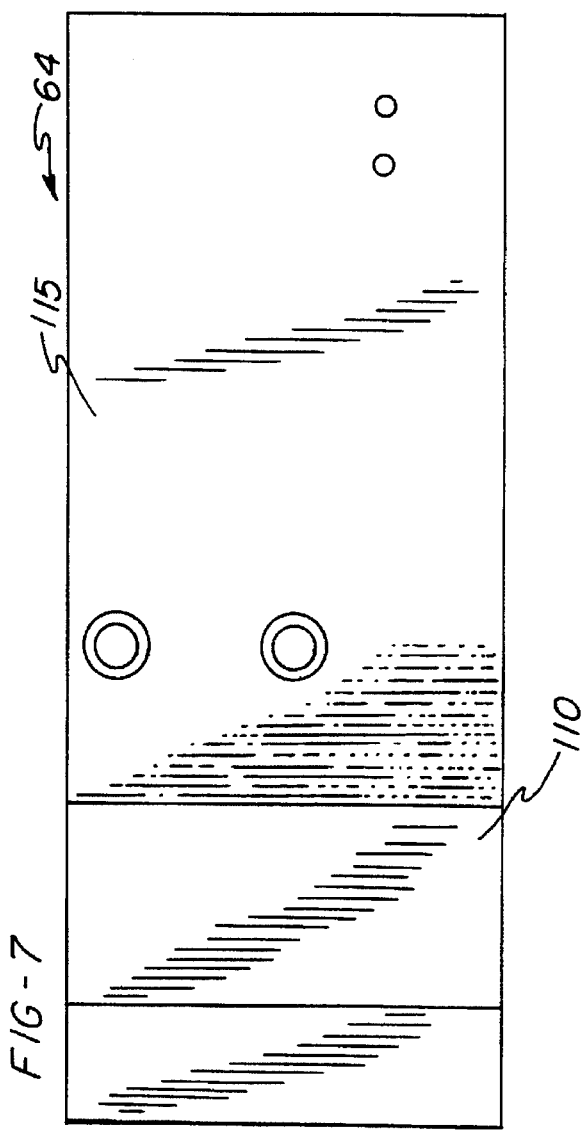
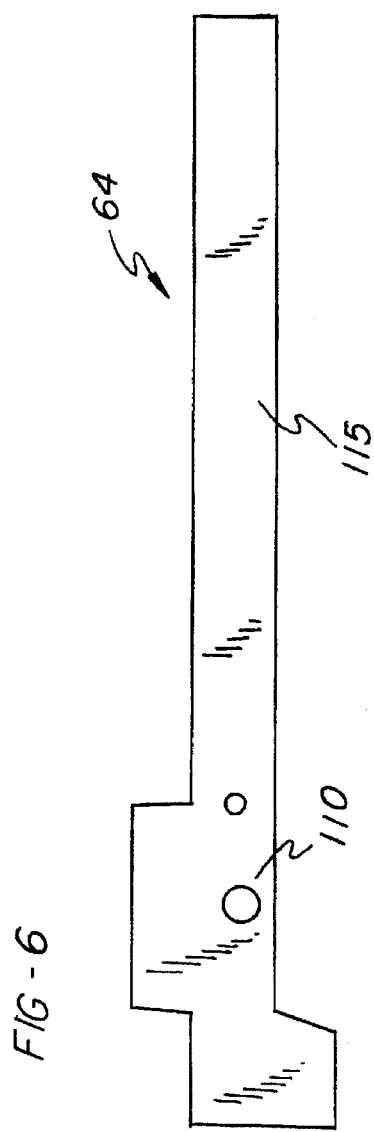

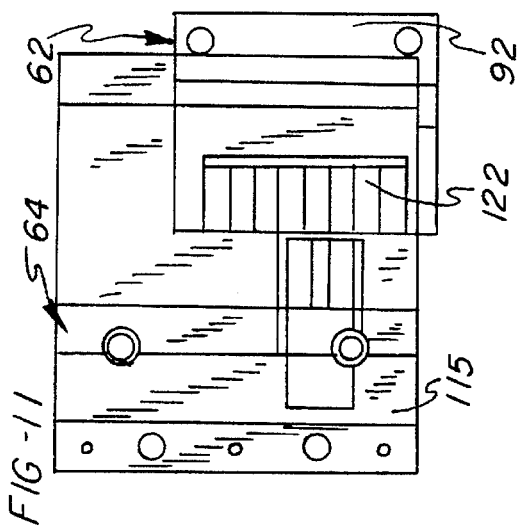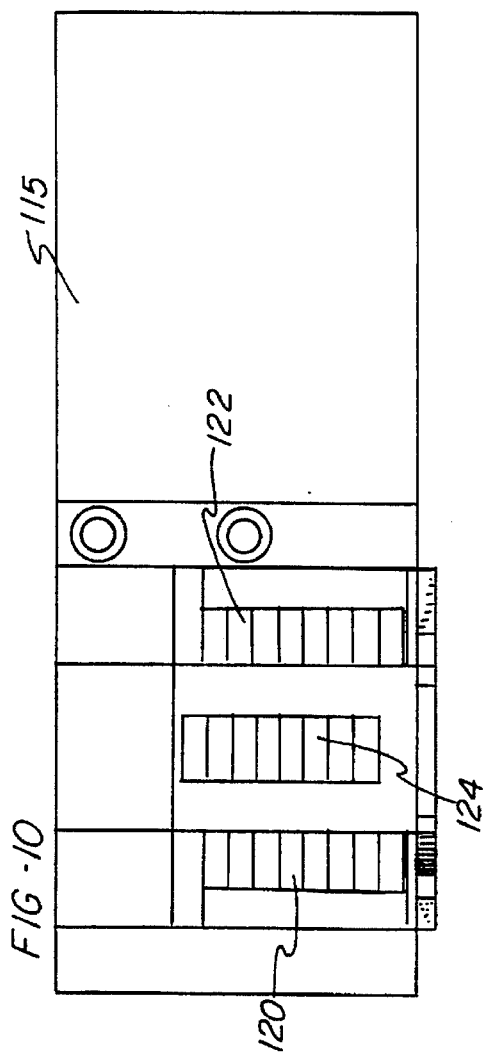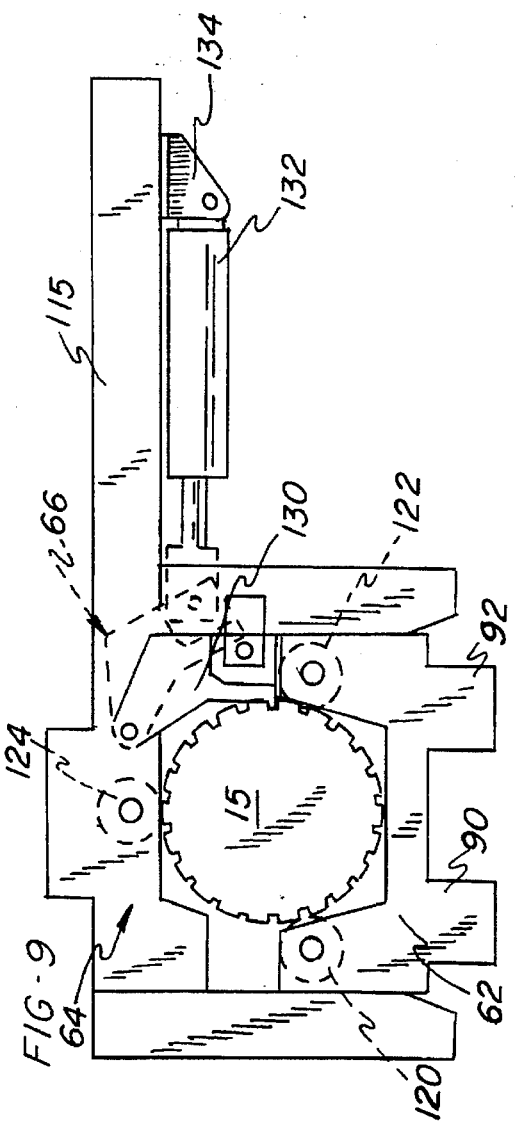

TEST CHUCK FOR ARMATURE TESTING

BACKGROUND OF THE INVENTION

This invention relates to an improved chuck for holding an electric motor armature for testing following its initial assembly.

In a typical armature test system, a conveyor moves assembled armatures to a testing station where the armatures are temporarily removed from the conveyor by means of a chuck. A motor armature includes a shaft and several coils of wire wrapped in slots formed between laminated iron and terminated by welding or staking in a commutator which includes contact bars.

One component of the chuck, a lower saddle, is attached to a pneumatic or hydraulic cylinder which is extended to lift the armatures off the conveyor and move them to a testing station where several electrical tests are performed. Another component of the chuck, the upper saddle, is associated with the testing station and includes a mechanism for positioning the armature as it is moved into position for testing.

The testing operation typically includes several tests, including: End-to-End Weld Test, which measures the electrical resistance of each wire-to-bar connection; Surge, where high voltage pulses are applied to individual coils and the resulting back-EMF ringing produced by the coils is measured as a function of time; Resistance, where the resistance of each coil in the armature is measured; and Hi-Pot, which is a test where high voltage is applied from the commutator to the grounded armature shaft.

Of particular concern in the present invention is the Surge test, which is a measure of the electrical inductance of each coil making up the tested armature. The use of a metal chuck to support the armature during testing adversely affects the quality of the surge or inductance test since the chuck becomes part of the magnetic path around each coil. Allowing the core of the armature to come into contact with a metal chuck attenuates the back-EMF ringing during the surge test. To overcome this problem, some prior art chucks have been made of stainless steel or Nylon™. Stainless steel, although not as detrimental to the surge test as mild steel, nevertheless dampens or attenuates the ringing. Nylon, while non-magnetic and therefore ideal for its lack of detrimental effect on the surge test, tends to wear quickly due to the rotation of the armature relative to the chuck during the loading procedure.

Accordingly, it would be desirable to provide an armature testing chuck which is both non-magnetic and resistant to wear.

SUMMARY OF THE INVENTION

The present invention is an improved non-magnetic chuck for holding an electric motor armature for testing. In the preferred embodiment of the invention, the chuck includes a support frame made of Nylon and three sets of ceramic rollers that engage the armature core. Neither the Nylon nor the ceramic rollers are magnetic materials, and thus the chuck of the present invention does not affect the surge test in any significant way. A metal armature indexing dog used to rotate the armature into proper position prior to testing is retracted during the testing to prevent it from affecting the results.

The ceramic rollers are carried on pins. The pins may be made of stainless steel. Since the pins are unconnected to any other magnetic material and are far from the armature, no measurable effect on the surge test is noticeable.

Accordingly, it is an object of this invention to provide a fixture for supporting an electric motor armature for testing comprising a frame constructed of a non-magnetic material, a plurality of rollers supported for rotation within said frame made of a non-magnetic, wear resistant material, an indexing mechanism for rotating said armature, and means for moving said indexing mechanism away from said armature during testing thereof.

Other objects and advantages of the invention will be apparent from the following description, the accompanying drawings and the appended claims.

BRIEF DESCRIPTION OF THE DRAWINGS

FIG. 1 is a functional block diagram showing the basic element employed in a motor armature testing station;

FIG. 2 is a simplified perspective view showing one form of armature testing station what can employ the non-metallic chuck of the present invention;

FIG. 6 is a front elevational view of an upper saddle component of the armature chuck of the present invention;

FIG. 7 is a plan view of the upper saddle shown in FIG. 6;

FIG. 8 is a side elevational view of the upper saddle shown in FIG. 6;

FIG. 9 is a front elevational view of the chuck of the present invention holding a motor armature in place, ready for testing;

FIG. 10 is a plan view of the chuck shown in FIG. 9; and

FIG. 11 is a side elevational view of the chuck shown in FIG. 9.

DESCRIPTION OF THE PREFERRED EMBODIMENT

Figure 5:
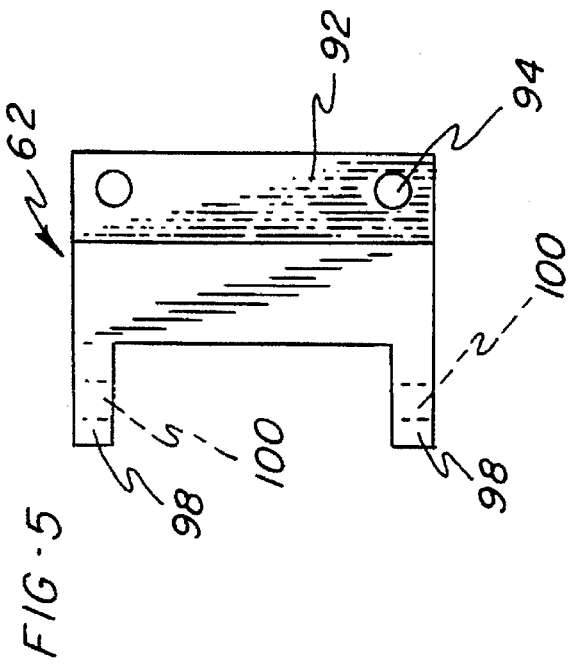
FIG. 5 is a side elevational view of the lower saddle shown in FIG. 3.

Referring now to the drawings, which show a preferred embodiment of this invention, and particularly to FIG. 1, which is a simplified diagram showing some of the various components making up a typical armature manufacturing line, armatures to be tested are assembled at 10 and individual armatures 15 are carried by conveyor 20, which is moved incrementally under control of a conveyor control module 25, past stations 26 and 27, to a testing station 30 where the armatures are each removed temporarily from the conveyor. A test console 35 includes control circuits for controlling the operation of the testing stations and associated components. The results of the testing operation are displayed for each armature on monitor 36 and the results are recorded on printer 37. After testing, the armatures are replaced on the conveyor 20 and moved to a receiving location.

Each armature typically includes a shaft 50, a plurality of windings 52 and a commutator 54. The windings 52 are wound with insulated wire which terminate at individual commutator bars (not shown). The quality of the insulation, the resistance of the electrical connection between the wire and the commutator bars, and the inductance of the windings are tested and the results recorded. One example of an armature connection resistance tester is shown in U.S. Pat. No. 5,140,276.

The testing station 30 is shown generally in FIG. 2. Individual armatures are held in an armature chuck 60 during testing. The armature chuck 60 includes three major components, a lower saddle 62, an upper saddle 64 and an armature positioning mechanism 66 (FIG. 9). The lower saddle 62 is attached to a conventional lifting cylinder 70, which moves the lower saddle vertically to transfer an armature between the conveyor and the testing station. As an armature 15 is lifted into the testing position, the armature positioning mechanism 66 rotates the armature to position the armature contact bars in the proper location for testing. Shaft stop cylinders engage one end of the armature shaft to provide support thereto while the other end of the armature shaft 50 is received into the test station.

The test station 30 includes at least one test head 75. As shown in FIG. 2, a second test head 77 may also be provided. Test heads 75 and 77 are moved in a direction perpendicular to the direction of motion of the conveyor 20 by means of test head extend cylinders 80 and 82, respectively. When extended, contact wires from the test head 75 are extended to engage electrically the armature contact bars in preparation for testing. As shown in FIG. 2, test head 75 is above the armature lifting cylinder 70 and its contact wires have engaged the contact bars of armature 15.

Figure 4:
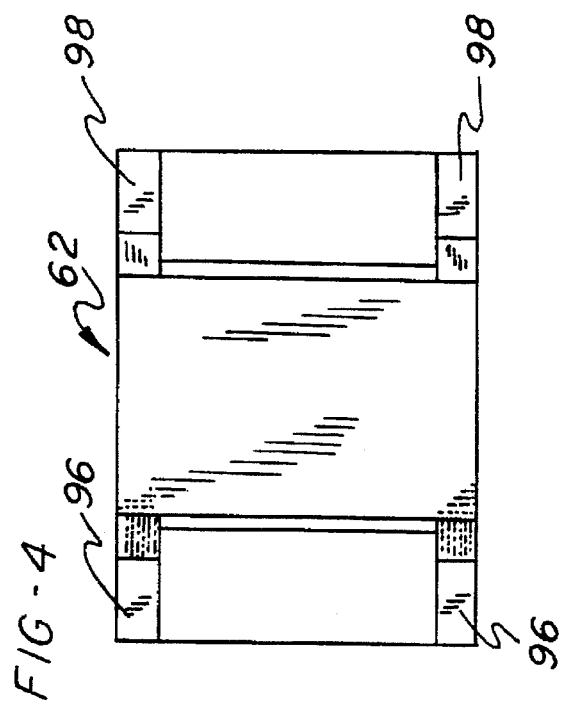
FIG. 4 is a plan view of the lower saddle shown in FIG. 3.
Figure 3:
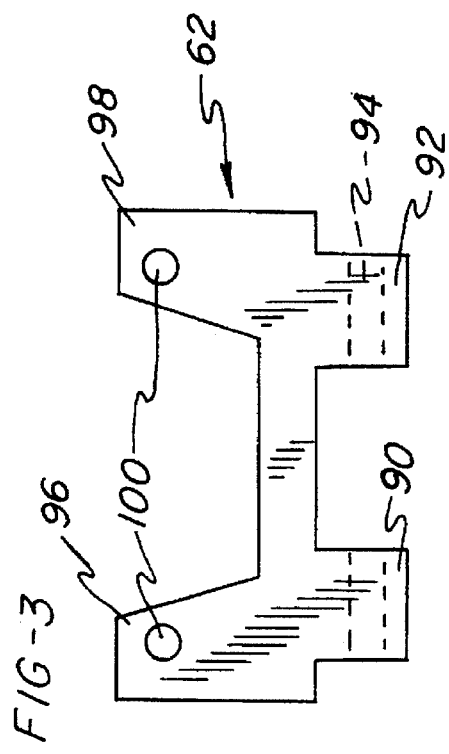
FIG. 3 is a front elevational view of a lower saddle component of the armature supporting chuck of the present invention.

FIGS. 3–5 show the lower saddle 62. FIG. 3 is an elevational view of the lower saddle 62 prior to ceramic rollers being installed. FIGS. 4 and 5 are plan and right elevational views corresponding to FIG. 3. The lower saddle 62 is made entirely of Nylon and is provided with lower extensions 90 and 92 having openings 94 which are used to attach the lower saddle to the cylinder 70 for vertical movement with respect to the conveyor 20. The lower saddle is also provided with a upwardly extending extensions 96 and 98; openings 100 are provided to receive pins or axles about which ceramic rollers may rotate.

FIGS. 6–8 show the upper saddle 64. FIG. 6 is an elevational view of the upper saddle 64. FIGS. 7 and 8 are plan and right elevational views corresponding to FIG. 6. The upper saddle 64 is also made entirely of Nylon and is formed with a recess 110 into which ceramic rollers may be mounted. The upper saddle also includes a plate 115 which is permanently attached to the test station's frame 100.

FIGS. 9–11 show the chuck 60 with the upper saddle 64 and lower saddle 62 completely assembled and with the lower saddle 62 fully raised with an armature 15 in place for testing. The lower saddle 62 is provided with two sets of ceramic rollers 120 and, 122 and the upper saddle 64 is provided with a single set of ceramic rollers 124. As shown, each set of ceramic rollers includes eight individual rollers.

The armature positioning mechanism 66 includes a spring loaded metal dog 130, shown in its operating position in full lines in FIG. 9. The armature positioning mechanism 66 is attached to the upper saddle 64. The spring loaded metal dog 130 engages a slot each armature 15 as it is being lifted into position, and if necessary, causes the armature to rotate thereby to place the contact bars of the commutator in proper position to receive the contact wires from the test head (75, 77). Since the dog is made of metal, its presence could affect the surge test. To eliminate this possibility, a cylinder 132 is mounted between the dog 130 and a bracket 134 which depends from plate 115 of the upper saddle 64. The cylinder causes the dog 130 to move fully clear of the armature, as shown by the dotted lines, after the armature is properly positioned in order to prevent the material from which the arm is constructed from interfering with the surge test.

As shown in FIGS. 9–11 the ceramic roller sets are preferably mounted at 120° relative to the axis of rotation of the armature 15, and each engages the metallic outer surface of the armature during the armature testing sequence. Since no magnetic components are touching or even near the armature during testing, the results will be due to the characteristics of the armature itself and will not be adversely affected by the components of the testing mechanism. In the present invention, the use of Nylon saddles provided with ceramic rollers insures a quality test while at the same time providing a wear resistant surface on which the armatures can be rotated during test. By using the present invention, the improvement in the quality of testing is illustrated by the following tables.

Table 1 represents the results of a test on an armature where no chuck or saddle was used; the test armature was merely place in the testing location without a chuck at all. Of particular interest is the surge test recorded in the sixth and seventh columns, marked Bar to Bar Surge. The ringing of each armature winding is measured in microseconds ($\mu S$). Table 2 represents the results of a test of the same armature using the present invention. Table 3 represents the results of the test of the same armature using a conventional stainless steel chuck. As is clearly evident from an inspection of these tables, the test results using the present invention (Table 2) are almost identical to Table 1 while the use of a stainless steel chuck (Table 3) shows a significant reduction in the ringing of the armature during the surge test. The orientation of the armature was the same in each test.

TABLE 1

No Chuck

| Step No. | Bar to Bar Resistance | | | Weld | Bar to Bar Surge | | | End to End |
|---|---|---|---|---|---|---|---|---|
| | $\Omega$ | $\Omega$ | % | $m\Omega$ | $\mu S$ | $\mu S$ | % | $\Omega$ |
| 1 | 0.149 | 0.148 | 0.4 | 0.0 | 9.9 | 9.9 | 0.1 | 0.892 |
| 2 | 0.149 | 0.148 | 0.6 | 0.0 | 10.3 | 10.1 | 2.3 | 0.892 |
| 3 | 0.154 | 0.153 | 1.1 | 0.1 | 10.6 | 10.4 | 1.9 | 0.892 |
| 4 | 0.158 | 0.157 | 0.6 | 0.0 | 10.8 | 10.5 | 2.6 | 0.892 |
| 5 | 0.161 | 0.160 | 0.8 | 0.0 | 11.0 | 10.5 | 4.5 | 0.892 |
| 6 | 0.164 | 0.162 | 1.2 | 0.1 | 11.0 | 10.9 | 0.7 | 0.892 |
| 7 | 0.166 | 0.164 | 1.1 | 0.0 | 10.4 | 11.0 | 5.2 | 0.892 |
| 8 | 0.169 | 0.167 | 1.4 | 0.0 | 10.6 | 10.8 | 1.8 | 0.892 |
| 9 | 0.172 | 0.169 | 1.9 | 0.1 | 11.1 | 10.9 | 1.0 | 0.892 |
| 10 | 0.175 | 0.172 | 1.7 | 0.1 | 10.2 | 10.5 | 2.7 | 0.892 |
| 11 | 0.176 | 0.175 | 0.8 | 0.0 | 9.8 | 10.4 | 6.4 | 0.892 |

TABLE 2

Nylon Chuck with Ceramic Rollers

| Step No. | Bar to Bar Resistance | | | Weld | Bar to Bar Surge | | | End to End |
|---|---|---|---|---|---|---|---|---|
| | $\Omega$ | $\Omega$ | % | $m\Omega$ | $\mu S$ | $\mu S$ | % | $\Omega$ |
| 1 | 0.149 | 0.148 | 0.4 | 0.0 | 10.1 | 9.8 | 2.9 | 0.891 |
| 2 | 0.149 | 0.148 | 0.4 | 0.0 | 10.3 | 10.0 | 2.3 | 0.891 |
| 3 | 0.154 | 0.153 | 1.0 | 0.1 | 10.5 | 10.3 | 1.7 | 0.891 |
| 4 | 0.158 | 0.157 | 0.8 | 0.0 | 10.7 | 10.5 | 2.6 | 0.891 |
| 5 | 0.161 | 0.160 | 0.9 | 0.0 | 10.9 | 10.4 | 4.5 | 0.891 |
| 6 | 0.164 | 0.162 | 1.2 | 0.0 | 10.9 | 10.8 | 0.6 | 0.891 |
| 7 | 0.166 | 0.164 | 1.5 | 0.0 | 10.3 | 10.9 | 5.6 | 0.891 |
| 8 | 0.169 | 0.166 | 1.5 | 0.0 | 10.5 | 10.7 | 1.5 | 0.891 |
| 9 | 0.172 | 0.169 | 1.6 | 0.1 | 10.9 | 10.8 | 0.8 | 0.891 |
| 10 | 0.174 | 0.172 | 1.1 | 0.0 | 10.1 | 10.4 | 2.6 | 0.891 |
| 11 | 0.176 | 0.175 | 0.7 | 0.0 | 9.7 | 10.3 | 6.5 | 0.891 |

TABLE 3

Stainless Steel Chuck

| Step No. | Bar to Bar Resistance Ω | Bar to Bar Resistance Ω | Weld % | mΩ | Bar to Bar Surge µS | Bar to Bar Surge µS | % | End to End Ω |
|---|---|---|---|---|---|---|---|---|
| 1 | 0.149 | 0.148 | 0.6 | 0.0 | 8.3 | 8.2 | 0.4 | 0.891 |
| 2 | 0.149 | 0.148 | 0.8 | 0.0 | 8.3 | 8.3 | 0.1 | 0.891 |
| 3 | 0.155 | 0.153 | 1.3 | 0.0 | 8.3 | 8.4 | 0.9 | 0.891 |
| 4 | 0.158 | 0.157 | 0.7 | 0.0 | 8.3 | 8.2 | 0.3 | 0.891 |
| 5 | 0.161 | 0.159 | 0.7 | 0.0 | 8.3 | 8.0 | 3.7 | 0.891 |
| 6 | 0.164 | 0.162 | 1.0 | 0.0 | 8.4 | 8.3 | 0.9 | 0.891 |
| 7 | 0.166 | 0.164 | 1.2 | 0.0 | 7.8 | 8.4 | 7.2 | 0.891 |
| 8 | 0.169 | 0.166 | 1.4 | 0.0 | 8.2 | 8.2 | 0.5 | 0.891 |
| 9 | 0.172 | 0.169 | 1.5 | 0.1 | 8.9 | 8.7 | 2.1 | 0.891 |
| 10 | 0.175 | 0.172 | 1.6 | 0.0 | 8.1 | 8.3 | 2.7 | 0.891 |
| 11 | 0.176 | 0.174 | 1.0 | 0.0 | 7.8 | 8.4 | 7.6 | 0.891 |

While the form of apparatus herein described constitutes a preferred embodiment of this invention, it is to be understood that the invention is not limited to this precise form of apparatus and that changes may be made therein without departing from the scope of the invention, which is defined in the appended claims.

What is claimed is:

1. In an apparatus for testing motor armatures including a testing station for testing the electrical characteristics of armatures, including its electrical inductance, a chuck for supporting an electric motor armature for testing comprising an upper saddle member and a lower saddle member, said lower saddle member provided with a plurality rollers for supporting the armature for rotation around its axis, the improvement comprising, said upper and lower saddle members being constructed of a non-magnetic material, and said plurality of rollers being constructed of a non-magnetic, wear resistant material.

2. The fixture of claim 1 further including an indexing mechanism mounted in said upper saddle member for rotationally positioning the armature, and means for moving said indexing mechanism away from said armature during testing thereof.

3. The fixture of claim 1 wherein said rollers are constructed of ceramic.

4. The chuck of claim 1 wherein said saddle members are constructed of Nylon.

5. In an apparatus for testing motor armatures including a testing station for testing the electrical characteristics of armatures, including its electrical inductance, a chuck for supporting an electric motor armature for testing comprising an upper saddle member a lower saddle member, a plurality of rollers mounted in said lower and upper saddle members for positioning the armature for rotation about its axis, and an indexing mechanism mounted in said upper saddle member for rotationally positioning the armature, the improvement comprising, said upper and lower saddle members being constructed of a non-magnetic material, said plurality of rollers being constructed of a non-magnetic, wear resistant material, and means for moving said indexing mechanism away from said armature during testing thereof.

6. A method of testing an electric motor armature comprising the steps of placing the armature in a lower saddle member formed from a non-magnetic material and which is provided with a plurality of ceramic rollers that support the armature while allowing rotation of the armature about its axis, raising the lower saddle member and the armature into a testing position where the armature contacts a plurality of ceramic rollers mounted in an upper saddle member, which is formed from a non-magnetic material, rotating the armature by an armature positioning mechanism to position contact bars carried by the armature in the proper location for testing, and moving the armature positioning mechanism away from said armature during testing of the armature.

* * * * *